(12) United States Patent
Shen et al.

(10) Patent No.: US 12,373,625 B1
(45) Date of Patent: Jul. 29, 2025

(54) TIMING DOMAIN BASED MODELING OF SWITCHING PROBABILITY AND SIGNAL CORRELATION

(71) Applicant: ANSYS, INC., Canonsburg, PA (US)

(72) Inventors: Qian Shen, Southborough, MA (US); Joao Geada, Chelmsford, MA (US)

(73) Assignee: ANSYS, INC., Canonsburg, PA (US)

( * ) Notice: Subject to any disclaimer, the term of this patent is extended or adjusted under 35 U.S.C. 154(b) by 755 days.

(21) Appl. No.: 17/652,199

(22) Filed: Feb. 23, 2022

(51) Int. Cl.
 *G06F 30/367* (2020.01)
 *G06F 30/3312* (2020.01)

(52) U.S. Cl.
 CPC ........ *G06F 30/367* (2020.01); *G06F 30/3312* (2020.01)

(58) Field of Classification Search
 USPC .......................................................... 716/113
 See application file for complete search history.

(56) References Cited

U.S. PATENT DOCUMENTS

| | | | | |
|---|---|---|---|---|
| 5,847,966 A * | 12/1998 | Uchino | ................... | G06F 30/33 716/109 |
| 7,882,464 B1 * | 2/2011 | Rochel | .................. | G06F 30/367 716/113 |
| 8,089,321 B2 * | 1/2012 | Hotta | ...................... | G06G 7/12 331/172 |
| 8,244,491 B1 * | 8/2012 | Zhang | ................. | G06F 30/3312 716/108 |
| 2003/0070150 A1 * | 4/2003 | Allen | ................... | G06F 30/3312 716/108 |
| 2004/0060022 A1 * | 3/2004 | Allen | ................... | G06F 30/3312 716/103 |
| 2009/0119037 A1 * | 5/2009 | Khalil | ................... | G06F 30/367 702/181 |
| 2010/0102290 A1 * | 4/2010 | Lu | ...................... | G11C 13/0097 977/890 |
| 2010/0218152 A1 * | 8/2010 | Tehrani | ................... | G06F 30/33 716/113 |

* cited by examiner

*Primary Examiner* — Mohammed Alam
(74) *Attorney, Agent, or Firm* — WOMBLE BOND DICKINSON (US) LLP

(57) ABSTRACT

According to one aspect of this disclosure, time domain information can be associated with switching probabilities and propagated through a simulated circuit during a static timing analysis to provide finer grain details for use by a power analysis of the simulated circuit (such as a dynamic voltage drop analysis or simulation). Signal correlations may also be propagated with the associated time domain information to provide further finer details for use in power analysis. A method according to one embodiment can include: determining, for each input pin of an aggressor element, a set of one or more time dependent input switching probabilities during a set of one or more corresponding timing windows in a simulated representation of a circuit; determining, from each time dependent input switching probability of each timing window, a set of time dependent output switching probabilities at an output pin of the aggressor element; and performing a power analysis for one or more victim circuit elements that are coupled to the aggressor element, the power analysis based on the set of time dependent output switching probabilities at the output pin of the aggressor element.

20 Claims, 11 Drawing Sheets

TIMING DOMAIN BASED MODELING OF SWITCHING PROBABILITY AND SIGNAL CORRELATION

BACKGROUND

This disclosure relates to systems and methods for designing electrical circuits such as integrated circuits. In particular, the disclosure relates to computer aided design and computer aided engineering which can use simulations, such as dynamic voltage drop simulations, of a design to test how well the design will work.

Circuit designers often analyze a circuit's power distribution network to verify that it can provide power during normal operation of the circuit. Dynamic voltage drop analysis is often done to simulate how a power grid or power distribution network in an integrated circuit will perform when data signals switch or toggle between voltage states, such as from high to low states, etc. Often, this switching can cause circuits to consume more power than when the circuit is idle (and therefore there is little switching). This increased power consumption can cause the power grid to deliver less than desired levels of voltage at one or more nodes or pins in the circuit, and this lowered level of voltage can affect the operation of logic circuits to the extent that the logic circuits may not operate correctly or as desired. Thus, circuit designers often use simulation software to perform dynamic voltage drop analysis before they finish the design of an electrical circuit and before the circuit is fabricated (e.g., before fabricating an integrated circuit that contains the circuit).

Conventional power analysis tools, such as dynamic voltage drop (DVD) simulators, use switching probabilities to provide more accurate assessment of voltage drops based on those switching probabilities. However, these conventional tools use static switching probabilities that are modeled on a per pin level. This generally overestimates the actual probability because the probability may not be constant in time and pin based probability overestimates by using the maximum probability possible. Thus, these conventional tools overestimate voltage drops (and hence provide pessimistic assessments).

SUMMARY OF THE DESCRIPTION

According to one aspect of this disclosure, time domain information (such as a timing window when an input signal can switch during a period of time) can be associated with switching probabilities and propagated through a simulated circuit during a static timing analysis to provide finer grain details for use by a power analysis of the simulated circuit (such as a dynamic voltage drop analysis or simulation). By determining when an input pin can switch over periods of time (e.g., timing windows) and by determining the switching probability during each timing window, a static timing analysis tool can propagate switching probabilities that are time dependent through a circuit design and then provide those time dependent switching probabilities (relative to specific timing windows) to a power analysis tool (e.g., a dynamic voltage drop simulator) to improve its results. Signal correlations (e.g., full or complete signal correlations) may also be propagated with the associated time domain information to provide further finer details for use in power analysis. In one embodiment, switching probability and signal correlation can be tracked and described in time for any specific pin at the same resolution as there are timing windows. This can improve the accuracy of the results of power analysis tools such as a dynamic voltage drop analysis or simulation.

A method according to one embodiment can include the following operations: determining, for each input pin of an aggressor element, a set of one or more time dependent input switching probabilities during a set of one or more corresponding timing windows in a simulated representation of a circuit; determining, from each time dependent input switching probability of each timing window, a set of time dependent output switching probabilities at an output pin of the aggressor element; and performing a power analysis for one or more victim circuit elements that are coupled to the aggressor element, the power analysis based on the set of time dependent output switching probabilities at the output pin of the aggressor element. In one embodiment, the aggressor element and the victim circuit elements are both coupled to a power distribution network in the circuit, and the power analysis comprises a dynamic voltage drop analysis to determine voltage drops on power supply pins of the one or more victim circuit elements, and the power supply pins are coupled to the power distribution network. The switching of aggressor elements in the circuit can reduce the power supply voltages that are available at the power supply pins of the one or more victim circuit elements. In one embodiment, the set of time dependent output switching probabilities are determined by propagating the time dependent input switching probabilities associated with their corresponding timing windows through each aggressor element to one or more outputs of the aggressor element.

In one embodiment, a static timing analysis tool can be used to associate the set of one or more time dependent input switching probabilities of each input pin of the aggressor element to a corresponding timing window in the set of one or more corresponding timing windows.

In one embodiment, the method can include the following further operations: comparing, for a victim circuit element in the one or more victim circuit elements, times of one or more switching windows of the victim circuit element to times of one or more switching windows at the output pin of the aggressor element to determine whether there are one or more overlaps in time; and performing the power analysis for the victim circuit element during the one or more overlaps in time while not performing the power analysis outside of the one or more overlaps in time. In one embodiment, each input switching probability in the set of one or more time dependent input switching probabilities is event driven such that a probability of an event during a period of time (e.g., a timing window) will establish a time dependent input switching probability (for that timing window) based on the probability of the event. In one embodiment, each time dependent input switching probability in the set of one or more time dependent input switching probabilities is specified by a user input.

In one embodiment, the method can include the following further operations: determining a set of one or more signal correlations between signals at each input pin of the aggressor element and signals at the output pin of the aggressor element by propagating signal correlations through the aggressor element. These signal correlations can also be associated with the timing windows that have associated switching probabilities. The power analysis can compute simulated voltage drops on power supply pins of the one or more victim circuit elements using the determined signal correlations (specified at a timing window resolution) as further described below.

The embodiments described herein can be used in a static timing analysis (STA) tool that is used to propagate timing information or windows in a circuit design, where each timing window can be associated with a switching probability and information indicating signal correlations with other signals. The signal correlation information can indicate that a timing window is fully correlated with another timing window (usually due to the causal relationship between the two timing windows—e.g., the timing window on the output of an inverter will always be completely correlated to the timing window on the input of the same inverter). The STA tool may receive the switching probabilities from a circuit designer or other user of a computer aided design system. The STA tool can provide the propagated switching probabilities and signal correlations to a power analysis tool (e.g., a dynamic voltage drop simulator) which can use this additional information to perform a more detailed power analysis that will provide more accurate results than conventional power analysis tools or simulators.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in dynamic random access memory (DRAM) which is volatile memory or in nonvolatile memory, such as flash memory or other forms of memory. The aspects and embodiments described herein can also be in the form of data processing systems that are built or programmed to perform these methods. For example, a data processing system can be built with hardware logic to perform these methods or can be programmed with a computer program to perform these methods and such a data processing system can be considered a simulation system.

The above summary does not include an exhaustive list of all embodiments and aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements.

DETAILED DESCRIPTION

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment. The appearances of the phrase "in one embodiment" in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

Figure 1:
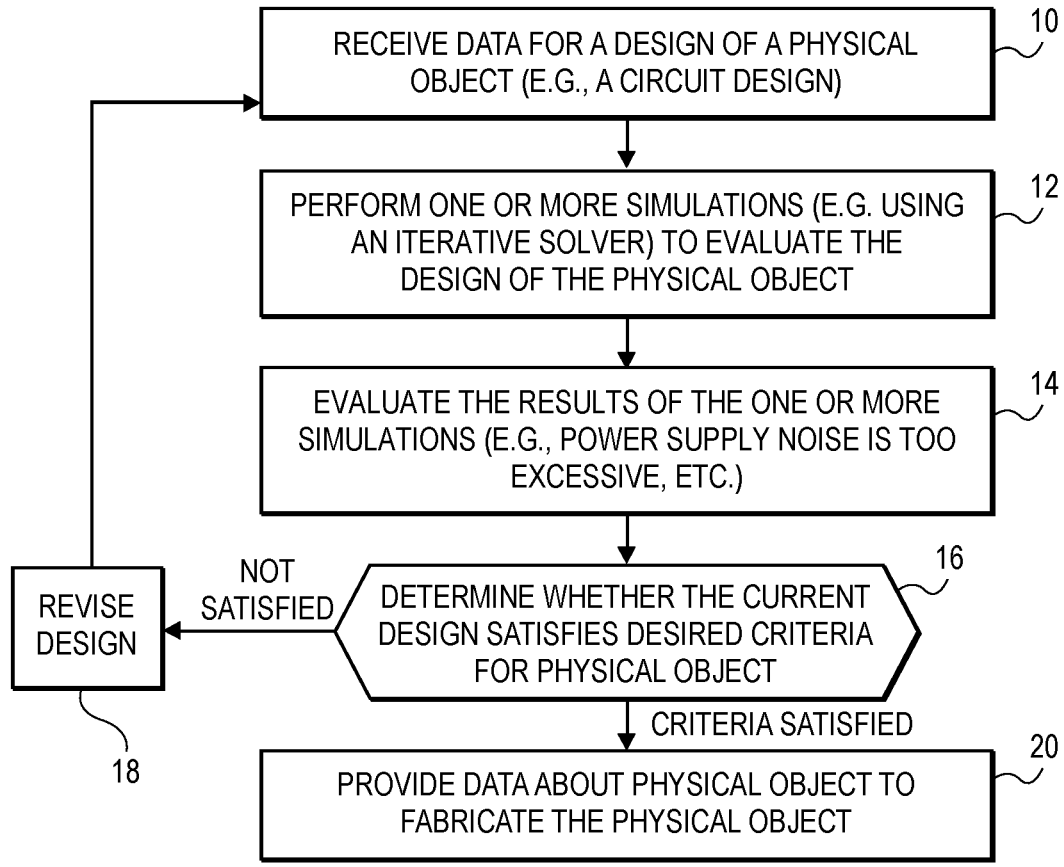
FIG. 1 is a flow chart that shows a method of using one or more embodiments described herein to design a circuit and to evaluate the design.

The embodiments described herein can be used in simulations of electrical circuits (for example, an IC) in order to determine whether a particular design of the IC satisfies particular requirements for the circuit or system containing the circuit. For example, there might be certain design requirements relating to a power distribution network or other portions in the IC. FIG. 1 shows a method in which these design requirements can be tested relative to a particular design of an IC which is being simulated. In operation 10 of FIG. 1, a data processing system (e.g., a computer executing simulation software to provide a simulation system) can receive data about a design for a particular IC package or other electrical circuit. The data can be created in CAD (computer aided design) software on a data processing system, and the data can include cell library information, other timing information and information about the geometry of the IC, pins and nets in the IC and information about the materials in the conductors and dielectrics (e.g., silicon dioxide, etc.) and sizes of the conductors and dielectrics, etc. Then in operation 12, the data processing system can perform one or more simulations (such as simulations based on physical models of the IC package and PCB) to evaluate the design of the IC by determining, for example, dynamic voltage drop values in the IC. These simulations can use the aspects and embodiments described herein. In operation 14, the designer can evaluate the results of one or more simulations to determine whether the design of the IC satisfies certain desired criteria for the design. This determination is shown in operation 16. If the one or more criteria is satisfied, then the designer in operation 20 can provide data about the circuit to allow the fabrication or manufacture of the IC or system. For example, if the one or more criteria are satisfied, a CAD file can be produced that describes how to build the IC or system. If the criteria are not satisfied as determined in operation 16, the designer can revise the design in operation 18 (for example, by changing sizes and/or quantity of the power distribution network in the IC or moving conductors in the design, etc.) and repeat the process by performing additional further simulations to evaluate the redesigned circuit. This can be repeated until the desired criteria are achieved for the circuit.

The embodiments in this disclosure can be employed to simulate a circuit or an IC that includes a power distribution network or grid of conductors that distribute power through the IC to various instances or cells or circuit elements (e.g., logic instances such as buffers, inverters, clocked registers, AND gates, OR gates, NAND gates, XOR gates etc.) in the IC. Each of the circuit elements is powered by at least two voltage supply pins; one voltage supply pin can supply a positive voltage (e.g. Vdd) and another voltage pin can supply another voltage, such as ground (e.g., Vss). The various circuit elements in the IC can all be coupled to the power distribution network, and when they switch, they can cause a voltage drop at the power supply pins of one or more victim circuit elements. The embodiments described herein can simulate these voltage drops with improved information that can make the power analysis more accurate relative to conventional approaches which overestimate voltage drops.

Figure 4A:
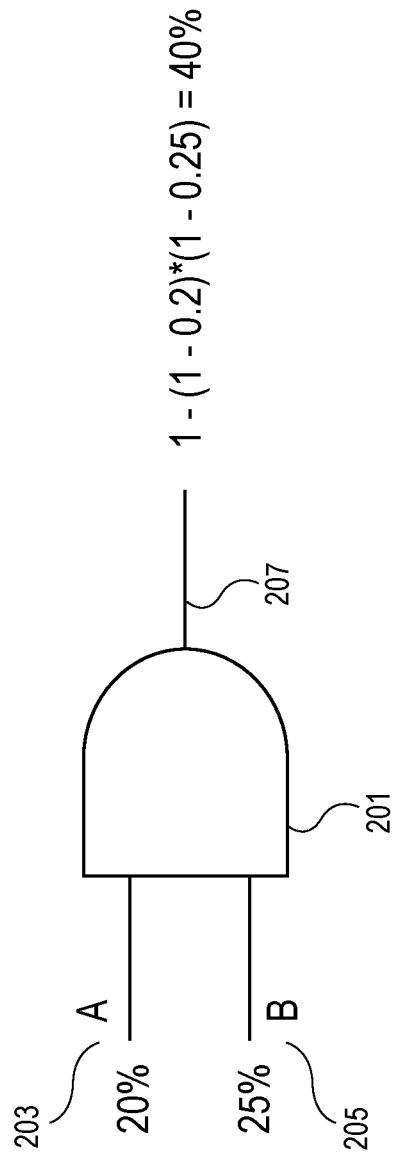
FIG. 4A shows a conventional method used to propagate pin based switching probability.

FIG. 4A shows an example of the conventional approach in which switching probability is based on each pin and does not take into account timing information; in other words, the conventional approach ignores time when propagating switching probability for the respective pin. The AND gate 201 in FIG. 4A has two input pins 203 and 205 and an output pin 207. The input pin 203 has a switching probability of 20%, and the input pin 205 has a switching probability of 25%. Under the conventional approach, the output pin 207 has a switching probability (calculated by propagating the input switching probabilities through the AND gate circuit element to the output pin 207) of 40% (computed as: 1−(1−0.2)*(1−0.25)). If the conventional approach also takes into account the possibility of a glitch (which can occur when both input pins 203 and 205 are switching at the same time), then the output pin 207 has a switching probability of 45% as shown in FIG. 4A. The glitch can affect the expected number of switching events. This conventional approach can be compared to an embodiment of the invention shown in FIG. 4B which uses time dependent switching probabilities that are associated with switching windows.

Figure 4B:
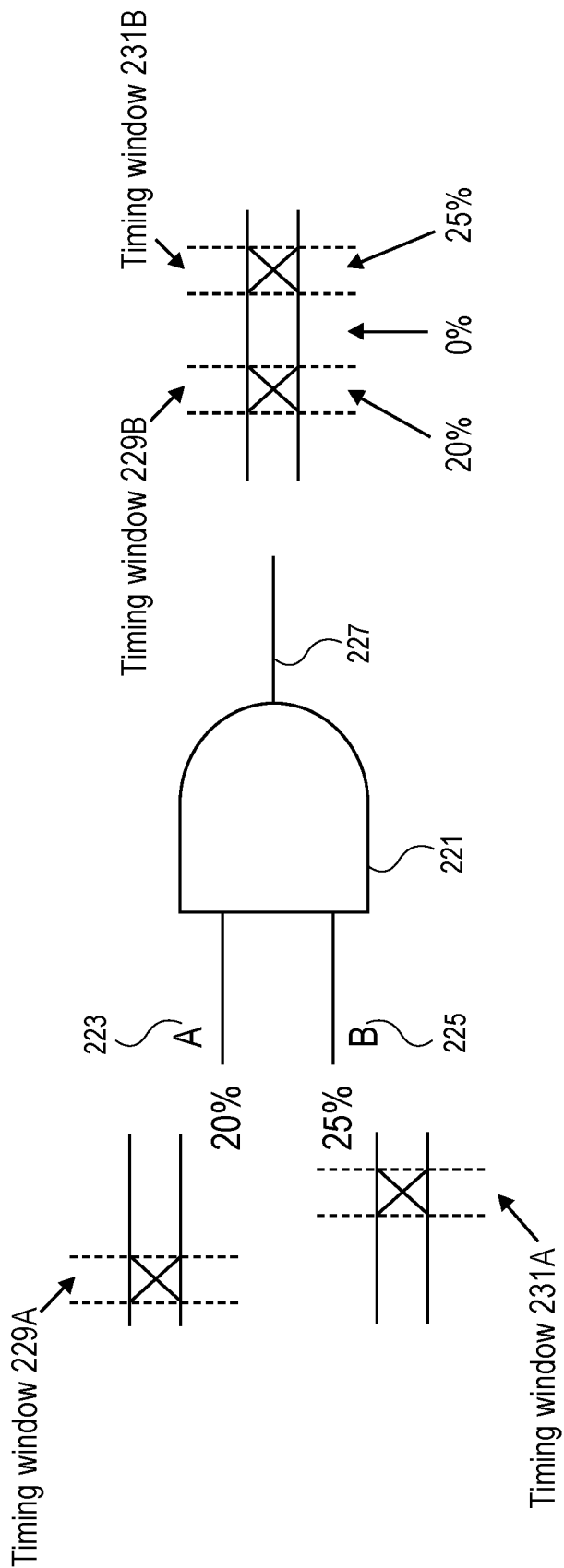
FIG. 4B shows a method for propagating timing window based switching probabilities.

FIG. 4B shows an AND gate 221 that has two input pins 223 and 225 and output pin 227. AND gate 221 has the same input switching probabilities as AND gate 201. Like AND gate 201 (in FIG. 4A), the input pin 223 has an input switching probability of 20% but this input switching probability is only during the timing window 229A as shown in FIG. 4B; at other times, the input pin 223 does not switch. The input pin 225 has an input switching probability of 25% but this input switching probability is only during the timing window 231A as shown in FIG. 4B; at other times, the input pin 225 does not switch. The timing window 229A does not overlap in time with timing window 231A as shown in FIG. 4B. As shown in FIG. 4B, timing window 229A is before, in time, the timing window 231A.

In one embodiment of the invention, a static timing analysis tool determines these timing windows and associates the switching probabilities (which may be provided by the circuit designer or other user) with each respective timing window. Thus, the timing window 229A is associated with the input switching probability of 20%, and the timing window 231A is associated with the input switching probability of 25%. In one embodiment, each of the input timing windows has an associated switching probability that is propagated with the timing window through the circuit element (which may be an aggressor element). The static timing analysis tool can then propagate each of these timing windows and their associated switching probabilities through the circuit to derive output switching probabilities based on the combination of switching probabilities and their associated timing windows. The propagation of each timing window with its associated switching probability is shown for output 227 in FIG. 4B. A static timing analysis tool can compute the propagation of the timing window 229A (as a result of delays through the AND gate 221) into the timing window 229B and compute the propagation of the timing window 231A into the timing window 231B. Rather than a single output switching probability of 40% (using the conventional approach shown in FIG. 4A), this embodiment determines three different output switching probabilities that depend on time (as shown in FIG. 4B). During a timing window 229B, there is a 20% switching probability on output pin 227 and during a timing window 231B, there is a 25% switching probability on output pin 227; between these two output timing windows and outside of these two output timing windows there is a zero percent output switching probability on output pin 227. Note that no probability, in the example in FIG. 4B, is greater than 25% (unlike the 40% probability in the example in FIG. 4A with the conventional approach). Thus, the embodiment in this example produces a less pessimistic assessment by virtue of switching probabilities associated with each timing window. Further, the output switching timing windows can be compared (in the time domain) to switching timing windows of a victim element as explained further below when performing a power analysis.

The timing window 229B was derived from timing window 229A by propagating the timing window 229A through AND gate 221; the propagation involves computing the delay through the AND gate and retaining the associated information about the switching probability associated with timing window 229A. The timing window 231B was derived from timing window 231A by propagating the timing window 231A through AND gate 221; the propagation involves computing the delay through the AND gate and retaining the associated information about the switching probability associated with timing window 231A.

This association of time domain information (e.g., timing windows) with switching probabilities can be referred to as timing window based switching probabilities, where each switching probability is time dependent. Thus, the switching probability at a pin depends on time, and can hence be referred to as a time dependent switching probability. This time dependency allows a power analysis tool (e.g., a dynamic voltage drop simulator) to compare the switching times of a victim circuit element to the switching times of possible aggressors and to use the associated switching probabilities to compute the power analysis in those situations in which the switching times (of aggressors and a victim element) overlap in time. This is explained further below (e.g., see FIG. 4D).

Figure 4C:
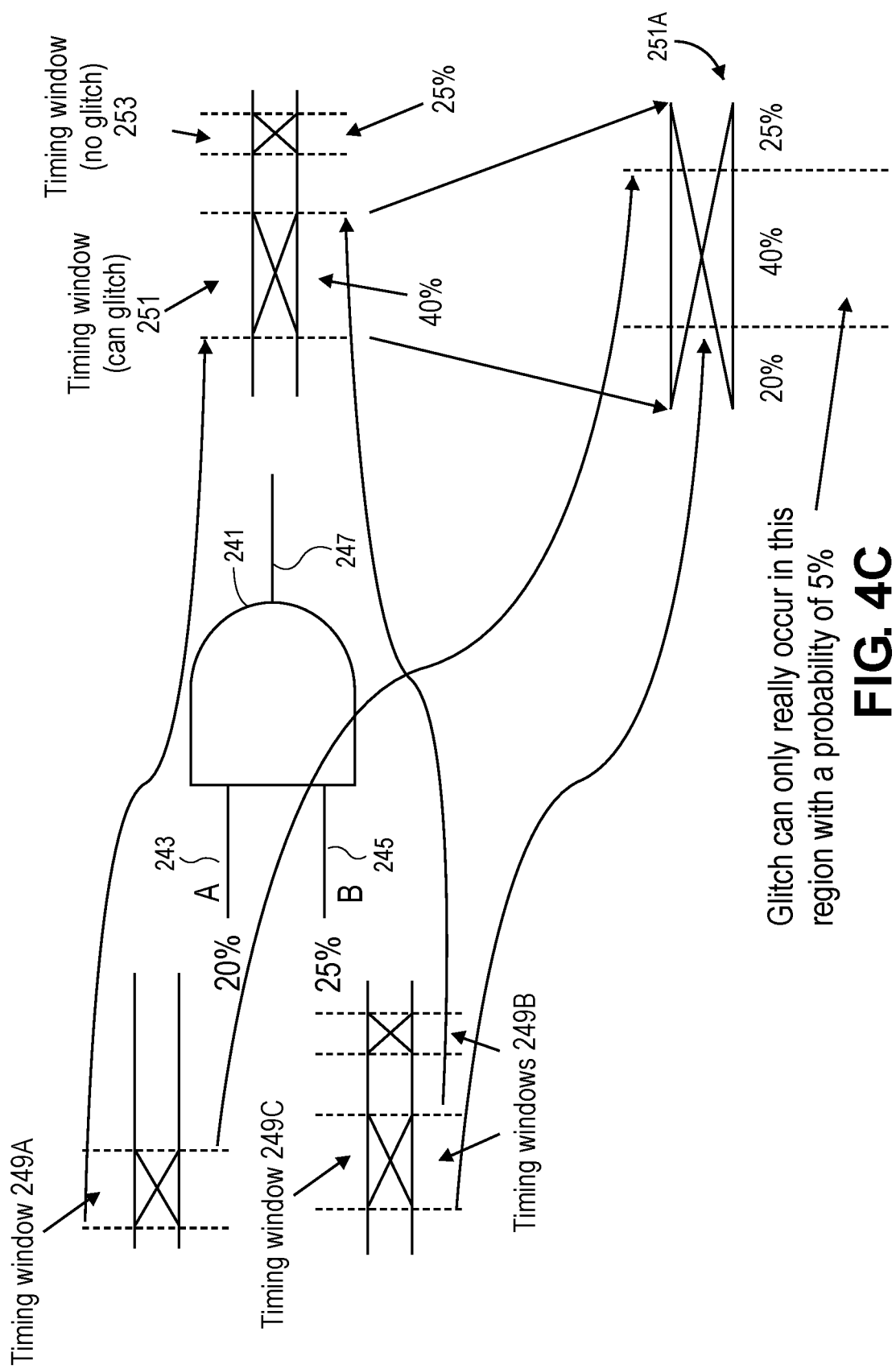
FIG. 4C shows another example of a method for propagating timing window based switching probabilities.
Figure 4D:
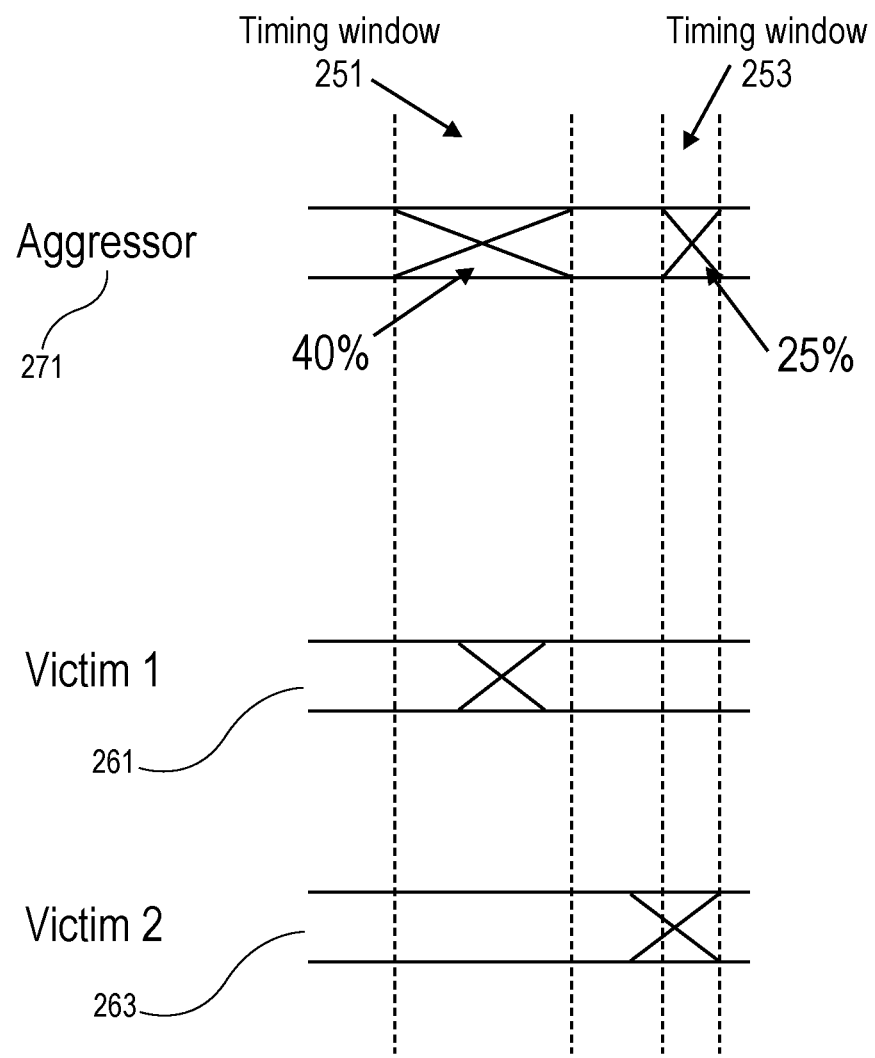
FIG. 4D shows how the propagated timing window based switching probabilities can improve power analysis.

FIG. 4C shows another example of an embodiment that uses time dependent switching probabilities that are propagated through the circuit under static timing analysis. The AND gate 241 has input pins 243 and 245. The input pin 243 has a single timing window 249A in which input pin has a switching probability of 20%; input pin 243 switches only during timing window 249A. The input pin 245 has two timing windows; a first timing window 249C and a second (in time) timing window 249B. Timing window 249A (for input pin 243) substantially (but not completely) overlaps with timing window 249C that is associated with input pin 245. Note that timing window 249A begins before timing window 249C begins and ends before timing window 249C ends. Input pin 245 has a 25% probability of switching during timing window 249C and has a 25% probability of switching during timing window 249B. Input pin 245 switches only during one of timing windows 249B and 249C. A static timing analysis tool can propagate these input switching timing windows through the AND gate 241 to produce the output switching timing windows 251 and 253 on the output pin 247 as shown in FIG. 4C. The output switching timing window 251 was derived from input switching timing windows 249A and 249C by propagating these input switching timing windows 249A and 249C through AND gate 241; the propagation involves computing the delay through the AND gate and retaining the associated information about the switching probabilities associated with these input switching timing windows 249A and 249C. The output switching timing window 253 was derived from input switching timing window 249B by propagating the timing window 249B through AND gate 221; the propagation involves computing the delay through the AND gate and retaining the associated information about the switching probability associated with timing window 249B. Most of the timing window 251 is associated with a 40% switching probability which is the maximum possible switching probability in the timing window 251, so the output switching probability for output pin 247 during the timing window 251 is 40%. For purposes of the embodiments, the maximum possible switching probability is used (which is 40% in this example). In this case, the resolution of the timing windows is not high enough to capture all three probabilities shown in the enlarged timing window 251A. These three probabilities are due to incomplete overlap of the input switching timing windows 249A and 249C. The output pin 247 switches only during one of the timing windows 251 and 253. The static timing analysis tool can provide this enhanced timing and associated switching probability data to a power analysis tool that can provide a more accurate power analysis (e.g., simulated dynamic voltage drop data). FIG. 4D shows an example of how this enhanced timing and associated switching probability data can be used in a power analysis.

FIG. 4D shows a power analysis based on the example in FIG. 4C. In this power analysis, the output 247 of AND gate 241 is treated as a possible aggressor of one or more victims in the circuit. The victims can be coupled to the same power distribution network as the possible aggressor, so when a victim switches at the same time that the aggressor switches, the aggressor can cause a voltage drop on one or more of the power supply pins of the victim (thereby adversely affecting the operation of the victim's circuit element). Often, the most impactful aggressors are near the one or more victims in the layout of the circuit. Further information about power analysis and dynamic voltage drop simulations can be found in U.S. patent application Ser. No. 17/094,602 which was filed on Nov. 10, 2020 by Applicant Ansys, Inc. and in U.S. patent application Ser. No. 16/723,894 which was filed on Dec. 20, 2019 by Applicant Ansys, Inc.; both of these US patent applications are hereby incorporated herein by reference. A power analysis tool in one embodiment can compare each victim's switching timing windows to the switching timing windows of an aggressor, and this comparison is shown in FIG. 4D. The aggressor 271 is the output 247 of AND gate 241 in FIG. 4C. The aggressor 271 has only two possible switching windows 251 and 253 in which it can switch, and specific, propagated switching probabilities are associated with each switching window. During other times outside of these two possible switching windows, the aggressor 271 does not switch (a zero probability of switching). Switching window 251 has a switching probability of 40%, and switching window 253 has a switching probability of 25%. One victim has a switching window 261 in which the victim can switch, and another victim has a switching window 263 in which the another victim can switch. Thus, the power analysis tool can determine that there is a 40% probability that the aggressor 271 can effect/attack (e.g., cause a voltage drop) the victim that can switch during switching window 261 and there is a 25% probability that the aggressor 271 can cause a voltage drop for the victim that can switch during switching window 263. This resulting power analysis is less pessimistic than the conventional approach (which would produce a 40% probability for both victims). This example shows how the time dependent switching probabilities (used by the embodiments described herein) can improve the accuracy of power analysis.

Figure 2:
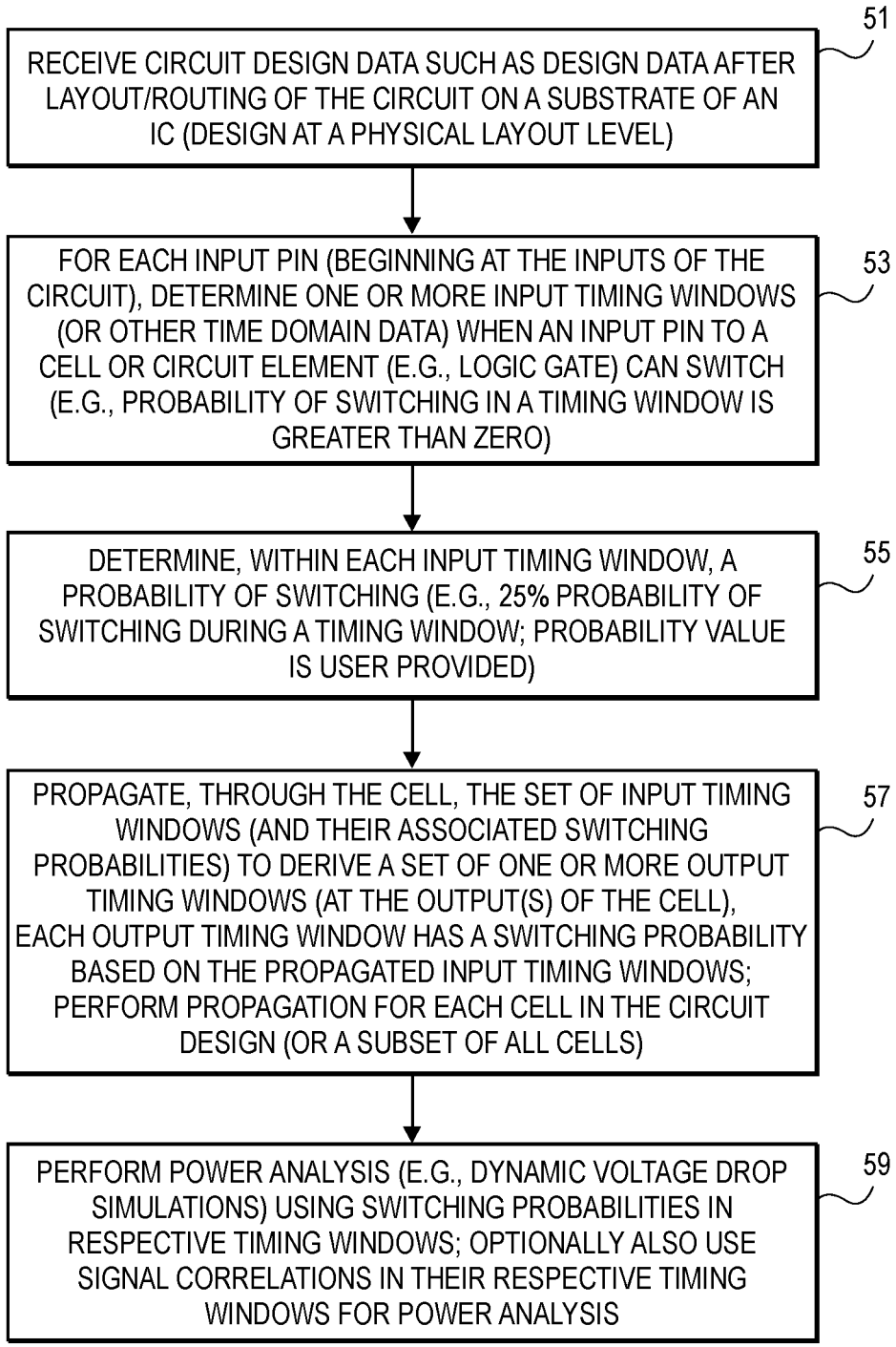
FIG. 2 is a flow chart that shows a method according to one embodiment.

FIG. 2 shows an example of a method that can use time dependent switching probabilities to perform power analyses of a circuit design. This method can be performed at least in part by a static timing analysis tool and in part by a power analysis tool. The method can begin in operation 51; in operation 51, a design system (e.g., a CAD system that executes simulation software that includes a static timing analysis tool and a power analysis tool) receives circuit design data. This data can be conventional CAD data such as, library data about each instance in a library of instances, and this data can include information (e.g., length, width, thickness) about the conductors and dielectrics in the IC's power gird so that effective resistances can be calculated as described herein. These calculations, which are based on this conventional information, are known in the art. The data can also specify a physical layout in which circuit elements are placed on a simulated physical space and signals are routed in conductors in the simulated physical space on the semiconductor substrate of the integrated circuit (IC). In addition, a circuit designer or other user of the design system can specify other data that will be used to determine switching probabilities during timing windows. In operation 53, the design system can determine for each input pin, one or more input timing windows (or other time domain data) when an input pin can switch (e.g., the probability of switching is greater than zero). These input timing windows can be referred to as input switching windows. FIGS. 4B and 4C show examples of the result of determining such input switching windows (e.g., windows 229A, 231A, 249A, 249B and 249C). In operation 55 the design system determines, for each input switching window, a probability of switching during the respective input switching window. In one embodiment, the circuit designer provides these switching probabilities (at least for the initial set of inputs at the beginning of the inputs of the circuit which are normally the inputs at the bonding pads of an IC); the provided switching probabilities are associated with their respective switching windows. Examples of these input switching probabilities are shown in FIGS. 4B and 4C.

In operation 57 the design system propagates, through each circuit element or cell in the circuit, the set of input switching timing windows (and their associated switching probabilities) to derive a set of one or more output switching timing windows at the outputs of each circuit element or cell. Each output switching window can have at least one switching probability based on the propagated input switching window. Examples of this propagation have been shown in FIGS. 4B and 4C.

In operation 59 the design system can perform a power analysis such as a dynamic voltage drop analysis (e.g., a DVD simulation) using the time dependent switching probabilities in their respective switching windows. FIG. 4D shows an example of such a power analysis. In one embodiment, this power analysis may also use signal correlation data as described further below in conjunction with FIGS. 5A, 5B and 5C.

Figure 5A:
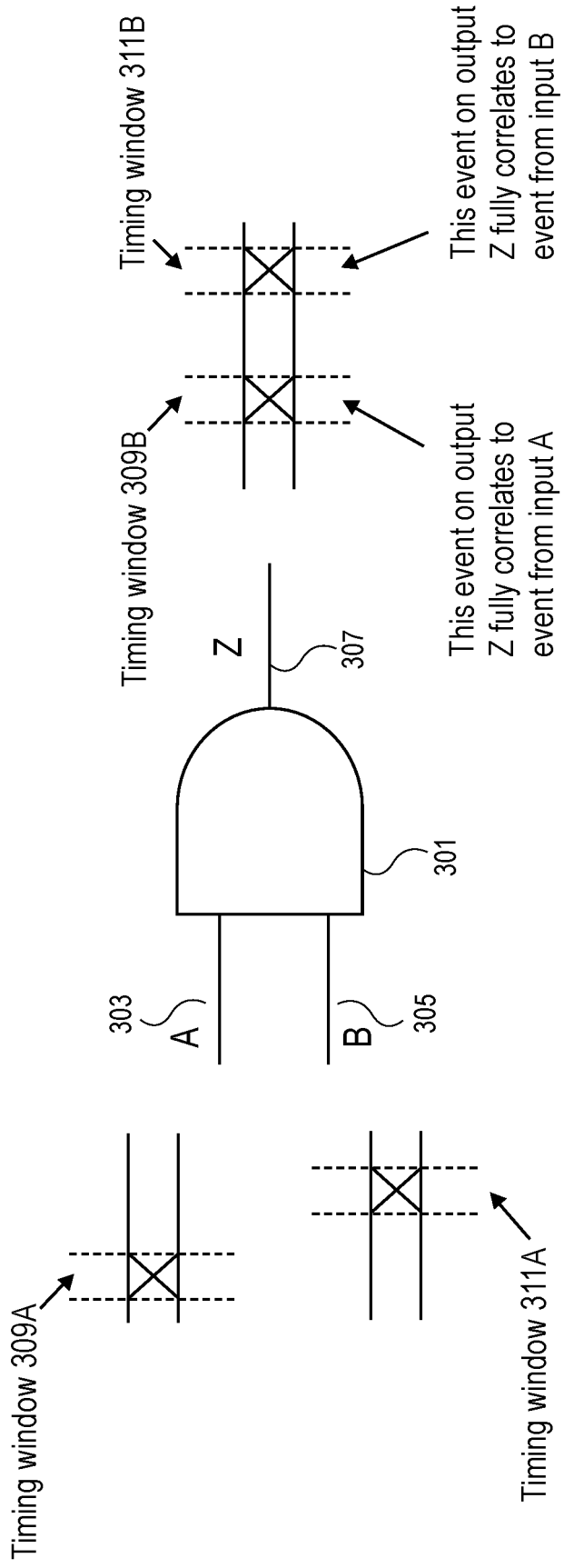
FIG. 5A shows an example of how signal correlation information can be used with associated timing windows.
Figure 5B:
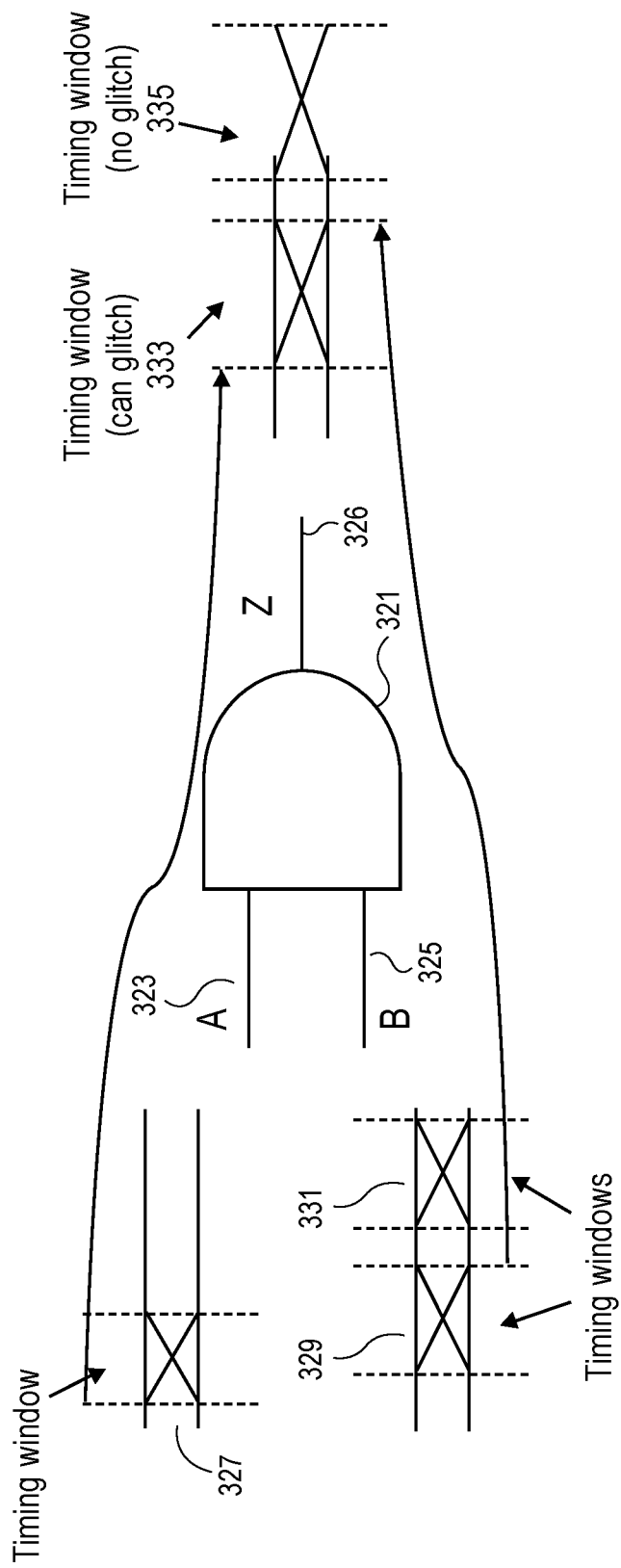
FIG. 5B shows another example of how signal correlation information can be used with associated timing windows.
Figure 5C:
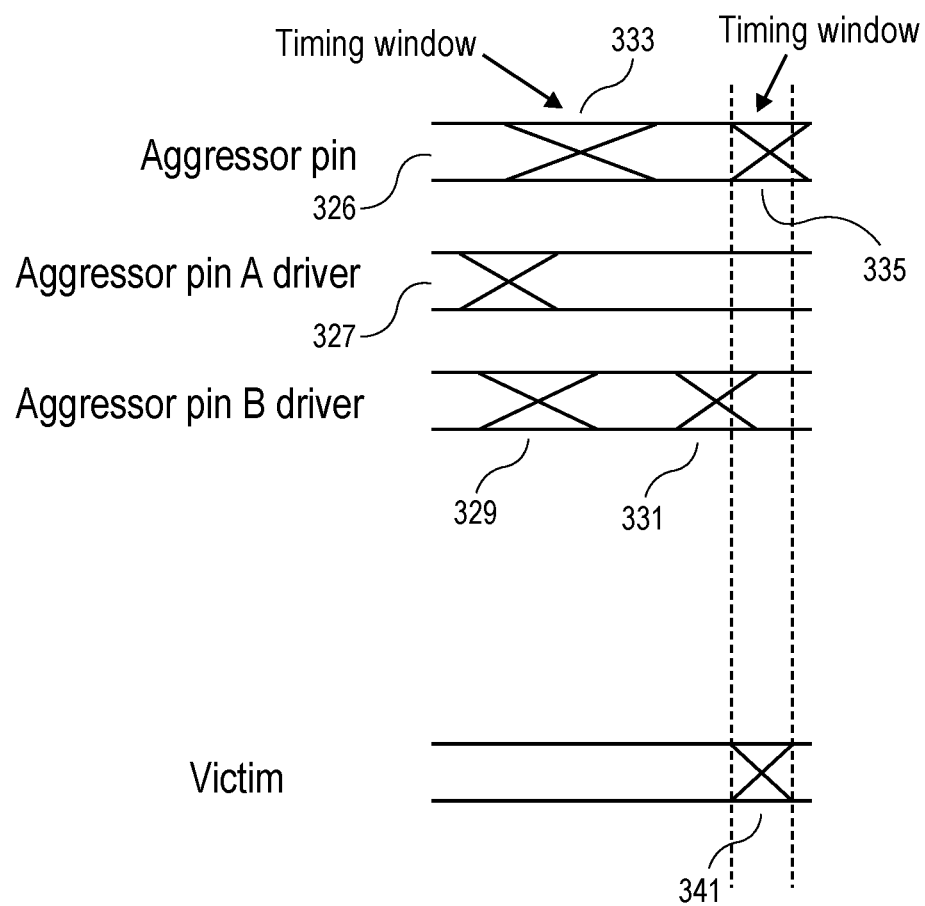
FIG. 5C shows how signal correlation information can be used with aggressor and victim timing windows.

FIGS. 5A, 5B and 5C show an embodiment that uses signal correlation data in the power analysis so that the accuracy of the power analysis is improved with both time dependent switching probabilities (or other time domain information) and signal correlation data. The AND gate 301 in FIG. 5A has input pins 303 and 305 and an output pin 307. The input pin 303 has an input switching window 309A, and the input pin 305 has an input switching window 311A. Thus, input pin 303 can only switch during the input switching window 309A (so outside of this input switching window there is a zero probability of switching for input pin 303). Input pin 305 can only switch during the input switching window 311A (so outside of this input switching window there is a zero probability of switching for input pin 305). Each of these input switching windows has an associated switching probability (not shown in FIG. 5A). The output pin 307 has two output switching windows 309B and 311B, each with an associated output switching probability propagated from the corresponding input switching window. In particular, the output switching window 309B is propagated from the input switching window 309A and is associated with the switching probability associated with the window 309A; the output switching window 311B is propagated from the input switching window 311A and is associated with the switching probability associated with the window 311A. FIG. 5A shows how signal correlation is not constant over time for a specific pin. FIG. 5A also shows how switching probability and signal correlation are propagated at the same time through the circuit design in one embodiment. The static timing analysis tool can also determine that the output switching window 309B is fully correlated with only the switching on input pin 303 because there is no other switching window during the time period of the switching window 309A; similarly, the static timing analysis tool can determine that the output switching window 311B is fully correlated with only the switching on input pin 303 because there is no other switching window during the time period of the switching window 309A. This means that any switching that occurs during window 309B is the result of switching that occurred only during window 309A (as a result of a switching on input pin 303), and this means that any switching that occurs during window 311B is the result of switching that occurred only during window 311A (as a result of a switching on input pin 305). In other words, switching during window 309B cannot be from a switching on input pin 305, and switching during window 311B cannot be from a switching on input pin 303. This signal correlation analysis, for at least inverters and buffers, correlates switching of an input signal to a switching at an output signal and also determines when there is no correlation during a specific time period based on the causal relationships of the timing windows, and this allows the power analysis tool to limit the aggressors of a victim based on this correlation as explained further herein. FIG. 5A illustrates that, without knowing the state of either input, it is possible to say the output of the AND is completely correlating to a specific input given a specific time period based on the causal relationships of the timing windows, which can be captured by STA.

FIG. 5B shows another example of an embodiment that uses signal correlation data in the power analysis so that the accuracy of the power analysis is improved with both time dependent switching probabilities and signal correlation data. The AND gate 321 in FIG. 5B has input pins 323 and 325 and an output pin 326. The input pin 323 has an input switching window 327, and the input pin 325 has an input switching window 329 and an input switching window 331 that follows the input switching window 329 in time. Thus, input pin 323 can only switch during the input switching window 327 (so outside of this input switching window there is a zero probability of switching for input pin 323). Input pin 325 can only switch during the input switching windows 329 or 331 (so outside of these input switching windows 329 and 331 there is a zero probability of switching for input pin 325). Each of these input switching windows has an associated switching probability (not shown in FIG. 5B). The output pin 326 has two output switching windows 333 and 335, each with an associated output switching probability propagated from the corresponding input switching window or windows. In particular, the output switching window 335 is propagated from the input switching window 331 and is associated with the switching probability associated with the window 331. The output switching window 333 is propagated from the input switching window 327 and the input switching window 329 and is associated with the switching probabilities associated with the windows 327 and 329. The static timing analysis tool can determine that the output switching window 333 is not fully correlated with either input pin because of the overlap in time between windows 327 and 329. The static timing analysis tool can also determine that the output switching window 335 is fully correlated with only the late switching (in switching window 331) on input pin 303 because there is no other switching window during the time period of the switching window 331; hence, any switching during window 335 can be attributed to switching on input pin 325 during the input switching window 331. This signal correlation can be used as described in connection with FIG. 5C to limit the aggressors during a voltage drop analysis by excluding at least one aggressor based on this signal correlation and information from the time domain (such as timing windows).

FIG. 5C shows an example, according to one embodiment, of how signal correlation data can be used to refine the power analysis by limiting the set of potential aggressors using the time information and the signal correlations. In addition, the time dependent switching probabilities can also be used during the process of propagation described herein (e.g., switching probabilities and signal correlations can be propagated through a circuit design and used in the power analysis together). It is possible for a time domain-specific complete signal correlation to propagate through complex multi-input logical gates. This is an advantage of a time domain-based signal correlation, which allows more complete signal correlation to be identified with time-domain constraints (e.g., net A completely correlates with net B, but only during this specific time period, whereas a pin-based signal correlation would simply have to say net A and net B do not completely correlate). The output pin 326 (in FIG. 5B) is treated as an aggressor with two switching windows 333 and 335 that have been described above. The switching window 327 created by the driver of input pin 323 and the switching windows on input pin 325 are shown with the victim switching window 341 in FIG. 5C. The victim switching window 341 shows that the victim can switch only during one time period that is near the end of the total time period. The victim switching window 341 overlaps (in time) with the switching window 335 (on the output pin 326) and overlaps in time with the switching window 331 (on the input pin 325) but does not overlap with any other switching windows in FIG. 5C. The static timing analysis tool can determine from these relationships in time and the signal correlations that, for the victim switching window 341, the output pin 326 is fully correlated with the input pin 325, which means that either the output pin 326 is causing a voltage drop at the victim or the driver of input pin 325 is causing the voltage drop, but not both at the same time because of the signal correlation. This signal correlation is the result of the fact that input pin 325 needs to switch first and then the output pin 326 switches (at a later time) as a result of the switching by the input pin 325. Thus, a power analysis tool can use select the output pin 326 as the aggressor and exclude the input pin 325 as an aggressor. In other words, the output pin 326 is considered an aggressor for power analysis but not both pins 326 and 325.

Figure 3:
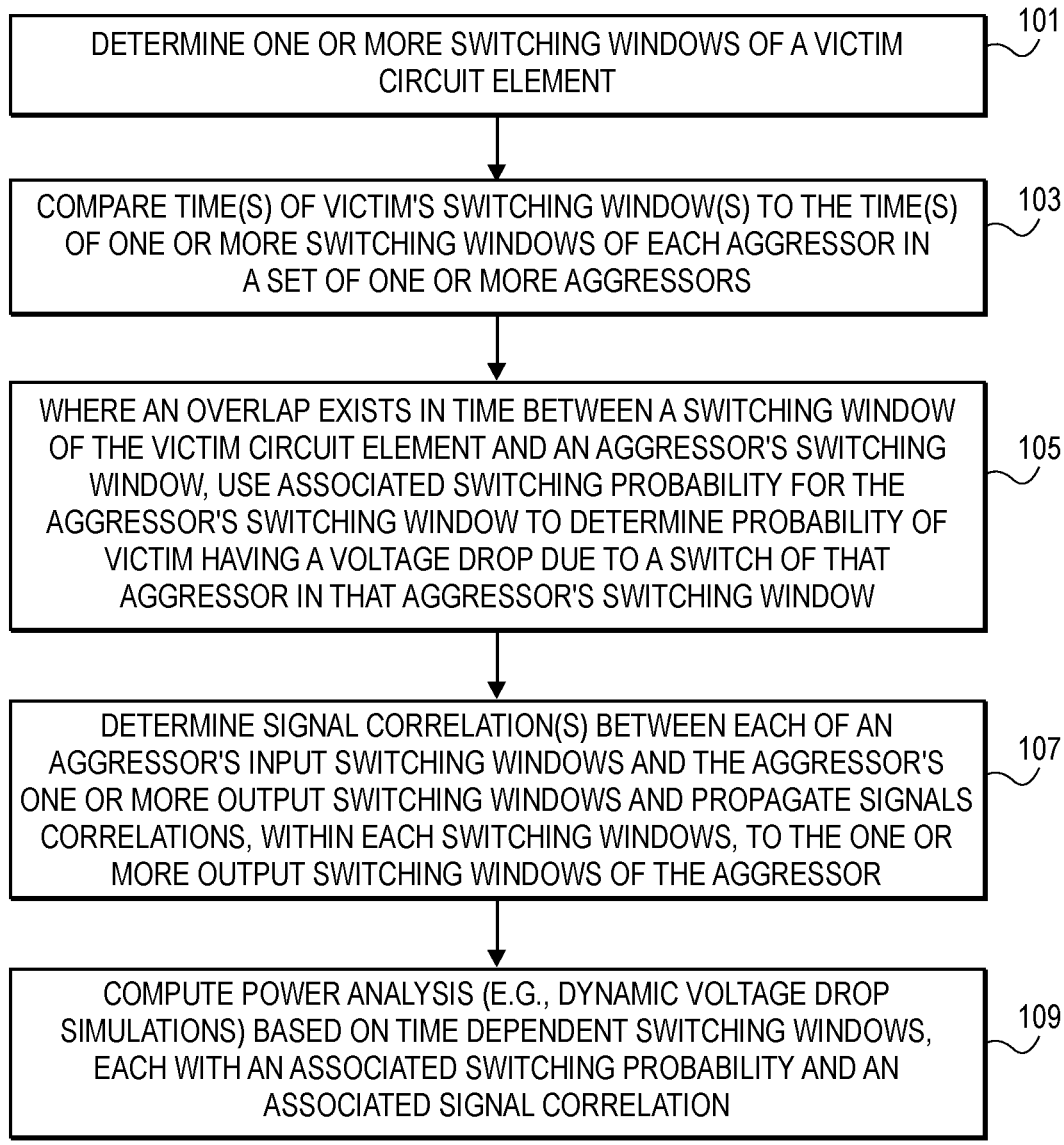
FIG. 3 is a flow chart that shows a method according to one embodiment.

An example of a static timing analysis and power analysis method according to one embodiment is shown in FIG. 3. In operation 101, a data processing system determines one or more switching windows of a victim circuit element; FIGS. 4D and 5C show timing diagrams that depict these victim switching windows. In operation 103, the data processing system compares the one or more times of the victim switching windows (for each victim) to the times of one or more switching windows of a possible set of aggressors (e.g., other circuit elements); this comparison allows the data processing system to determine overlaps in time between a victim switching window and an aggressor's switching window. FIGS. 4D and 5C show timing diagrams that depict these overlaps in time. These one or more determined overlaps are used in operation 105. When an overlap in time exists between a victim's switching window and an aggressor's switching window, the associated switching probability of the aggressor's switching window is used to determine a probability of the victim having a voltage drop due to a switching of that aggressor in that aggressor's switching window. In operation 107, the data processing system can use signal correlation data as described herein; this signal correlation data can be associated with switching windows and propagated through the circuit just like the switching probabilities are propagated through the circuit. It is possible that an output timing window does not completely correlate with an input timing window (e.g., an AND gate); in such a case, the signal correlation carried by the input timing window would not be propagated to the output timing window and the output timing window would start with a new signal correlation identifier that propagates further. Then in operation 109, a power analysis tool can compute a power analysis (such as a dynamic voltage drop simulation) based on the time dependent switching probabilities and the signal correlation data.

Figure 6:
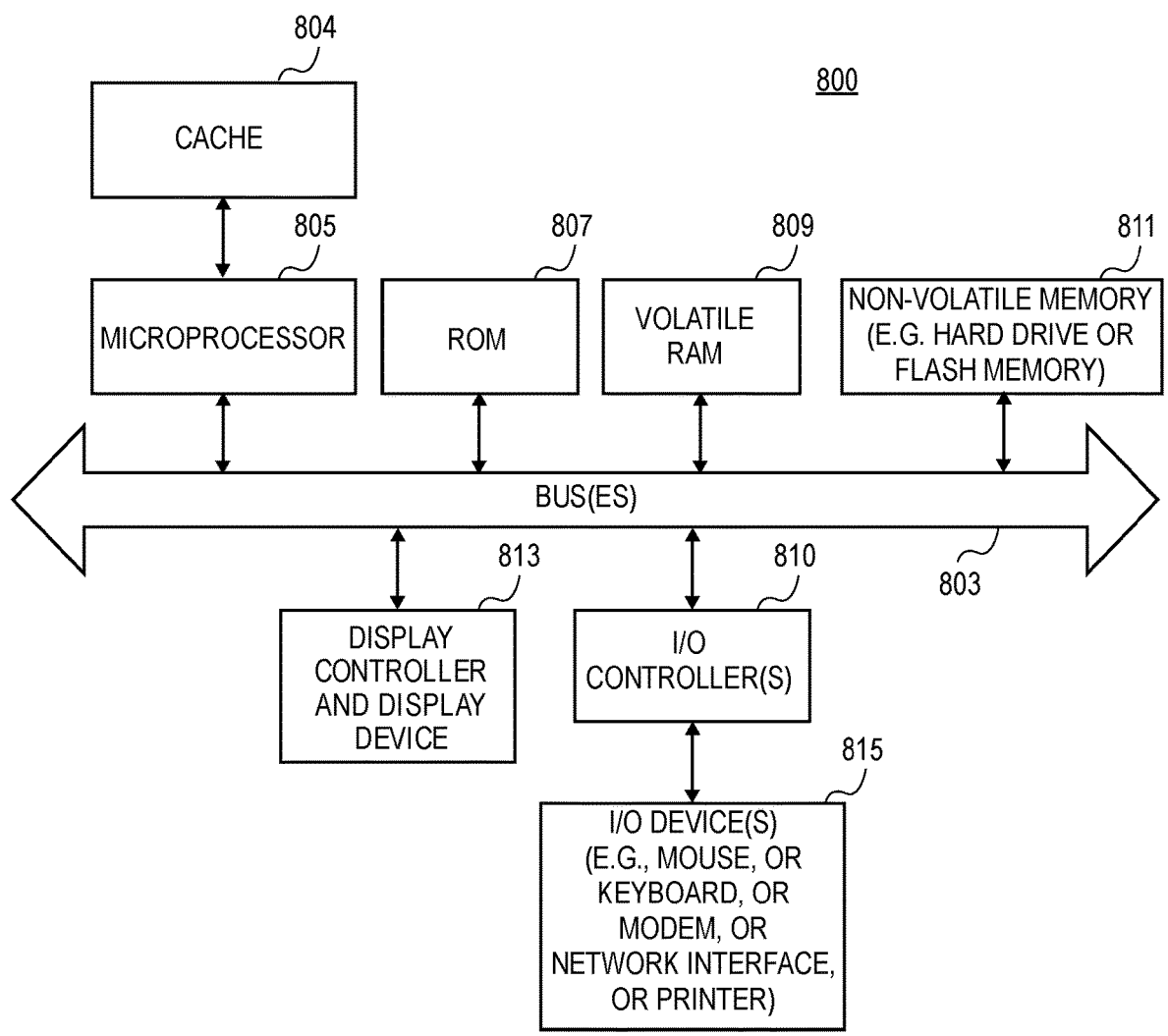
FIG. 6 shows an example of a data processing system that can be used to implement one or more embodiments described herein.

FIG. 6 shows one example of a data processing system 800, which may be used with one embodiment. For example, the system 800 may be implemented to provide a system or device that performs any one of the methods described herein. Thus, the system 800 is an example of a simulation system, and the system 800 can execute the simulation software described herein. Note that while FIG. 6 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 6, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811 and execute the instructions to perform operations described above. The microprocessor(s) 805 may contain one or more processing cores. The bus 803 interconnects these various components together and also interconnects these components 805, 807, 809, and 811 to a display controller and display device 813 and to peripheral devices such as input/output (I/O) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 6 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a non-transitory computer readable storage medium, such as, but not limited to, any type of disk including floppy disks, optical disks, CD-ROMs, and magnetic-optical disks, DRAM (volatile), flash memory, read-only memories (ROMs), RAMs, EPROMs, EEPROMs, magnetic or optical cards, or any type of media suitable for storing electronic instructions, and each coupled to a device bus.

A machine readable medium includes any mechanism for storing information in a form readable by a machine (e.g., a computer). For example, a non-transitory machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more non-transitory memories (e.g., one or more flash memories, random access memories (static, dynamic or other)), optical disks, CD-ROMs, DVD ROMs, EPROMS, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)) and then stored in non-transitory memory (e.g., DRAM or flash memory or both) in the client computer.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A non-transitory machine readable medium storing executable program instructions which when executed by a data processing system cause the data processing system to perform a method, the method comprising:
   determining, for each input pin of an aggressor element, a set of one or more time dependent input switching probabilities during a set of one or more corresponding timing windows in a simulated representation of a circuit;
   determining, from each time dependent input switching probability of each timing window, a set of time dependent output switching probabilities at an output pin of the aggressor element; and
   performing a power analysis for one or more victim circuit elements that are coupled to the aggressor element, the power analysis based on the set of time dependent output switching probabilities at the output pin of the aggressor element and correlations between timing windows of input pins of the aggressor element and timing windows of the output pin of the aggressor element.

2. The non-transitory machine readable medium as in claim 1, wherein the aggressor element and the victim circuit elements are both coupled to a power distribution network in the circuit, and wherein the power analysis comprises a dynamic voltage drop analysis to determine voltage drops on power supply pins of the one or more victim circuit elements, and the power supply pins are coupled to the power distribution network.

3. The non-transitory machine readable medium as in claim 2, wherein determining the set of time dependent output switching probabilities comprises propagating the time dependent input switching probabilities associated with their corresponding timing windows through each aggressor element to one or more outputs of each aggressor element.

4. The non-transitory machine readable medium as in claim 3 wherein the method further comprises: receiving a first description of a physical layout of the circuit in a substrate, the physical layout specifying sizes of conductors in the power distribution networks.

5. The non-transitory machine readable medium as in claim 4, wherein the method further comprises: receiving a second description of the physical layout of the circuit after the power analysis indicates a defective design and results in a redesign of the circuit.

6. The non-transitory machine readable medium as in claim 3, wherein a static timing analysis tool associates the set of one or more time dependent input switching probabilities of each input pin of the aggressor element to a corresponding timing window in the set of one or more corresponding timing windows.

7. The non-transitory machine readable medium as in claim 3, wherein the method further comprises:
   comparing, for a victim circuit element in the one or more victim circuit elements, times of one or more switching windows of the victim circuit element to times of one or more switching windows at the output pin of the aggressor element to determine whether there are one or more overlaps in time; and performing the power analysis for the victim circuit element during the one or more overlaps in time while not performing the power analysis outside of the one or more overlaps in time.

8. The non-transitory machine readable medium as in claim 6, each input switching probability in the set of one or more time dependent input switching probabilities is event driven such that a probability of an event during a period of time will establish a time dependent input switching probability based on the probability of the event, and wherein each time dependent input switching probability in the set of one or more time dependent input switching probabilities is specified by a user input.

9. The non-transitory machine readable medium as in claim 1, wherein the method further comprises: determining a set of one or more signal correlations between signals at each input pin of the aggressor element and signals at the output pin of the aggressor element by propagating signal correlations through the aggressor element.

10. The non-transitory machine readable medium as in claim 9, wherein the power analysis computes simulated voltage drops on power supply pins of the one or more victim circuit elements using the determined signal correlations.

11. A machine implemented method, the method comprising:
determining, for each input pin of an aggressor element, a set of one or more time dependent input switching probabilities during a set of one or more corresponding timing windows in a simulated representation of a circuit;
determining, from each time dependent input switching probability of each timing window, a set of time dependent output switching probabilities at an output pin of the aggressor element; and
performing a power analysis for one or more victim circuit elements that are coupled to the aggressor element, the power analysis based on the set of time dependent output switching probabilities at the output pin of the aggressor element and correlations between timing windows of input pins of the aggressor element and timing windows of the output pin of the aggressor element.

12. The method as in claim 11, wherein the aggressor element and the victim circuit elements are both coupled to a power distribution network in the circuit, and wherein the power analysis comprises a dynamic voltage drop analysis to determine voltage drops on power supply pins of the one or more victim circuit elements, and the power supply pins are coupled to the power distribution network.

13. The method as in claim 12, wherein determining the set of time dependent output switching probabilities comprises propagating the time dependent input switching probabilities associated with their corresponding timing windows through each aggressor element to one or more outputs of each aggressor element.

14. The method as in claim 13 wherein the method further comprises: receiving a first description of a physical layout of the circuit in a substrate, the physical layout specifying sizes of conductors in the power distribution networks.

15. The method as in claim 14, wherein the method further comprises: receiving a second description of the physical layout of the circuit after the power analysis indicates a defective design and results in a redesign of the circuit.

16. The method as in claim 13, wherein a static timing analysis tool associates the set of one or more time dependent input switching probabilities of each input pin of the aggressor element to a corresponding timing window in the set of one or more corresponding timing windows.

17. The method as in claim 13, wherein the method further comprises:
comparing, for a victim circuit element in the one or more victim circuit elements, times of one or more switching windows of the victim circuit element to times of one or more switching windows at the output pin of the aggressor element to determine whether there are one or more overlaps in time; and
performing the power analysis for the victim circuit element during the one or more overlaps in time while not performing the power analysis outside of the one or more overlaps in time.

18. The method as in claim 16, each input switching probability in the set of one or more time dependent input switching probabilities is event driven such that a probability of an event during a period of time will establish a time dependent input switching probability based on the probability of the event, and wherein each time dependent input switching probability in the set of one or more time dependent input switching probabilities is specified by a user input.

19. The method as in claim 11, wherein the method further comprises: determining a set of one or more signal correlations between signals at each input pin of the aggressor element and signals at the output pin of the aggressor element by propagating signal correlations through the aggressor element.

20. The method as in claim 19, wherein the power analysis computes simulated voltage drops on power supply pins of the one or more victim circuit elements using the determined signal correlations.

* * * * *